US006946368B1

(12) United States Patent
Vandroux et al.

(10) Patent No.: US 6,946,368 B1
(45) Date of Patent: Sep. 20, 2005

(54) REDUCTION OF NATIVE OXIDE AT GERMANIUM INTERFACE USING HYDROGEN-BASED PLASMA

(75) Inventors: Laurent Vandroux, Saint Nazaire les Eymes (FR); Hervé Monchoix, St. Imier (FR)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/808,160

(22) Filed: Mar. 23, 2004

(51) Int. Cl.[7] .......................................... H01L 21/322
(52) U.S. Cl. ..................................... 438/475; 438/796
(58) Field of Search ............... 438/660, 677, 438/787–790, 775–777, 795–798, 471–477

(56) References Cited

U.S. PATENT DOCUMENTS

| 4,590,091 A | * | 5/1986 | Rogers, Jr. et al. ......... 438/694 |
| 2003/0139035 A1 | * | 7/2003 | Yim et al. .................. 438/643 |
| 2004/0241341 A1 | * | 12/2004 | Lin ........................... 427/569 |

* cited by examiner

Primary Examiner—David Nelms
Assistant Examiner—Calvin Lee
(74) Attorney, Agent, or Firm—Townsend & Townsend & Crew

(57) ABSTRACT

A germanium substrate is positioned in a process chamber. A plasma is generated from a treatment gas that includes a flow of a hydrogen-containing gas. The plasma is provided to the process chamber to react with $GeO_2$ in the germanium substrate.

22 Claims, 5 Drawing Sheets

REDUCTION OF NATIVE OXIDE AT GERMANIUM INTERFACE USING HYDROGEN-BASED PLASMA

BACKGROUND OF THE INVENTION

Although germanium was once relatively commonly used in semiconductor-device fabrication, it has in recent decades been almost entirely displaced by the use of silicon, which is a much more manageable substance that is easy to work with. For this reason, virtually the entire semiconductor industry is currently focused on the use of silicon and on improvements that may be made to device-fabrication processes that use silicon. While the history of such improvements over the last several decades has been impressive, leading to revolutionary silicon-processing techniques, the ability to exploit the properties of silicon is beginning to approach physical limits. In particular, the major impediment to improvements in device speeds of silicon-based devices may soon be dictated by the carrier-mobility characteristics of the material, rather than by technological processing constraints, such as the ability to produce devices of certain sizes and the like.

As these physical limits of silicon are approached, there is likely to be an increased search for alternative substrate materials that have more favorable properties. One advantage that germanium has over silicon is that the carrier mobilities in germanium may exceed the mobilities of silicon, thereby allowing even further improvements in device speeds. One difficulty, though, is that germanium is generally impure, having a native oxide $GeO_2$ that is notably unstable. The existence of this native oxide effectively precludes the use of germanium substrates in many modern semiconductor-processing techniques, such as in processes that deposit dielectric layers over the substrate. With modern structures having very small feature sizes, the presence of the oxide in germanium substrates interferes adversely with the operation of resulting devices.

There is accordingly a general need in the art for methods to improve germanium interfaces by reducing the presence of this native oxide in a manner consistent with high-throughput processing techniques currently used in the semiconductor industry.

BRIEF SUMMARY OF THE INVENTION

Embodiments of the invention thus provide methods and systems for reducing oxide contamination of germanium substrates and for forming dielectric layers over germanium substrates. Such embodiments make use of a plasma oxide-reduction process that exposes the germanium substrate to a plasma that comprises hydrogen ions, which react with the native oxide.

Thus, in one set of embodiments, a germanium substrate is positioned in a process chamber. A plasma is generated from a treatment gas that comprises a flow of a hydrogen-containing gas. The plasma is provided to the process chamber to react with $GeO_2$ in the germanium substrate.

In some such embodiments, the plasma is generated remotely from the process chamber while in other embodiments it is generated in the process chamber. In some instances, the germanium substrate may be heated to a temperature less than 550° C., such as to a temperature between 350 and 550° C. There are a variety of different constituents that may be used to make up the treatment gas. For instance, in one embodiment the treatment gas further comprises a flow of a diluent gas such as an inert gas or $N_2$.

The hydrogen-containing gas may comprise a gas that contains nitrogen but does not contain silicon, such as ammonia, or may comprise $H_2$ in one embodiment.

After treating the germanium substrate in this way to reduce oxide contamination, a protective amorphous-silicon layer may be deposited on the germanium substrate by generating a plasma from a protective layer gas that comprises a flow of a silicon-containing gas. This may be comprise terminating the flow of the hydrogen-containing gas and initiating the flow of the silicon-containing gas without terminating the plasma. Alternatively, the plasma from the treatment gas may be terminated, with the plasma from the protective-layer gas being initiated thereafter.

After deposition of the protective amorphous-silicon layer, a dielectric layer may be deposited, such as an oxide layer or a nitride layer. In some embodiments, the dielectric layer may be deposited using a plasma deposition process.

A further understanding of the nature and advantages of the present invention may be realized by reference to the remaining portions of the specification and the drawings.

DETAILED DESCRIPTION OF THE INVENTION

Embodiments of the invention provide methods and systems for reducing oxide contamination of germanium substrates and forming dielectric layers over germanium substrates. These embodiments make use of a plasma treatment in a dielectric chemical-vapor-deposition ("CVD") chamber, with the plasma including hydrogen ions that react with the $GeO_2$ comprised by the germanium substrates. The reduction reaction with the hydrogen ions reduces the presence of the oxide, and it is believed by the inventors that water ($H_2O$) vapor and germane ($GeH_4$) are included in the byproducts of the reduction reaction. In some embodiments, the plasma comprises an ammonia plasma produced by generating a plasma from a flow of $NH_3$, although in other embodiments other sources of hydrogen are used, such as by generating a plasma from a flow of $H_2$. The use of a plasma reaction advantageously allows the oxide-reduction treatment to be performed at significantly lower temperatures than a purely thermal treatment.

Figure 1:
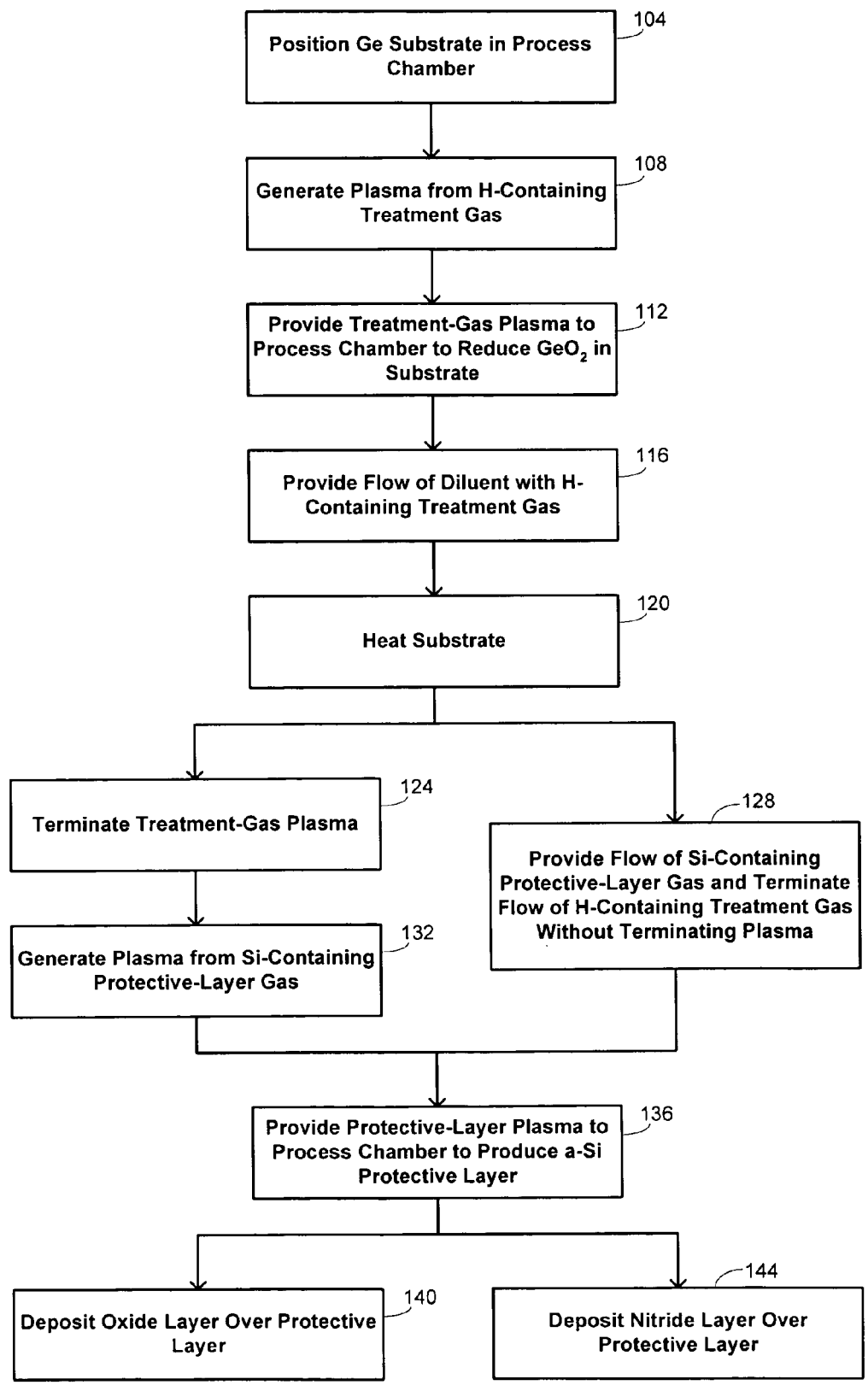
FIG. 1 is a flow diagram that illustrates methods for reducing oxide contamination of germanium substrates and forming dielectric layers over the substrates in embodiments of the invention.
Figure 2:
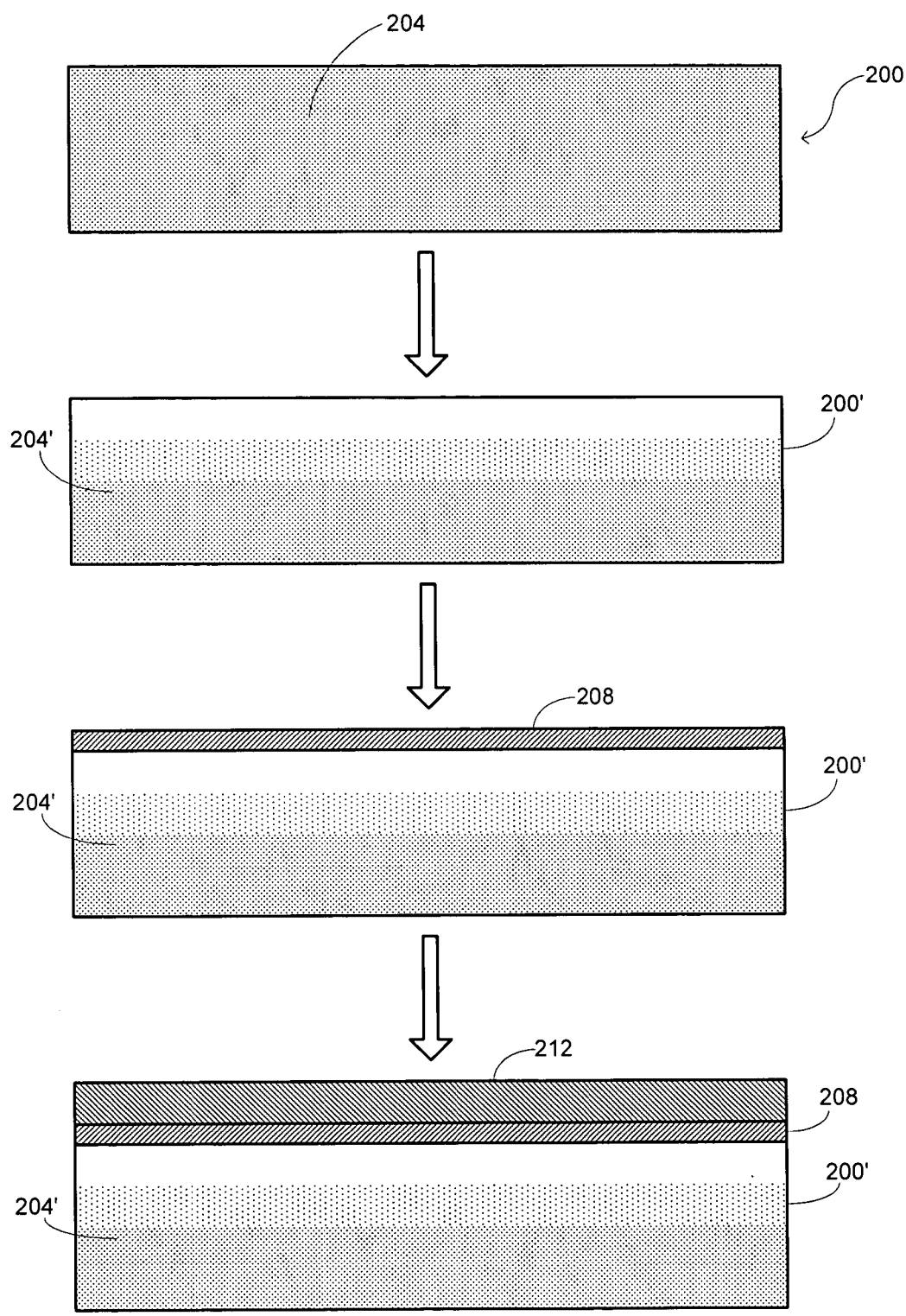
FIG. 2 provides a series of schematic cross-sectional drawings illustrating a progression of a germanium-based structure when using the methods illustrated in FIG. 1.

An overview of methods of the invention is provided with the flow diagram of FIG. 1. The description of FIG. 1 that follows sometimes makes reference also to FIG. 2, which provides a series of schematic cross-sectional drawings illustrating a progression of a structure at different stages of the method described in connection with FIG. 1. At block 104 of FIG. 1, the germanium substrate is positioned in the process chamber of a dielectric CVD system. The first panel of FIG. 2 shows an initial view of the germanium substrate 200, in which the presence of the native oxide $GeO_2$ 204 is indicated by stippling. At block 108 of FIG. 1, a plasma is generated from a hydrogen-containing treatment gas such as $NH_3$ or $H_2$. The methods of the invention are not restricted by plasma density and may effectively use a wide range of plasma densities, even exceeding $10^{11}$ ions/cm$^3$ as may be provided with electron-cyclotron-resonance ("ECR") or high-density-plasma ("HDP") systems in some embodiments. The plasma may be formed within the chamber or may be formed with a remote plasma source in different embodiments.

At block 112, the treatment-gas plasma is provided to the process chamber to reduce the $GeO_2$ in the germanium substrate. The effect of the reduction reaction with the hydrogen ions comprised by the plasma is illustrated in the second panel of FIG. 2, with the native oxide 204' becoming less dense towards the top surface of the germanium substrate 200', as indicated by the progressively more disperse stippling. This progression indicates that the effect of the reduction reaction induced by the plasma is greatest at the surfaces where the plasma may interact with the substrate 200', although some of the native oxide may remain in the bulk of the substrate 200'. Effective reduction of the native oxide at the substrate surface is sufficient to provide an improved interface for deposition of a dielectric as described further below. The reduction treatment is not especially sensitive to the flow rate of the treatment gas, which may provide an effective treatment at flow rates of about 50–500 sccm. In some instances, as indicated at block 116, greater control may be exerted over the process by including a diluent gas with the treatment gas. The purpose of the diluent gas is to use a flow rate suitable to control the concentration of hydrogen atoms in the plasma as desired, without introducing chemical species that will have undesirable reactions with the germanium or $GeO_2$ comprised by the substrate. Accordingly, suitable diluent gases include inert gases like Ar, Ne, and He, as well as gases such as $N_2$, which is particularly suitable when ammonia is used as the hydrogen source since it merely acts to increase the concentration of nitrogen ions relative to hydrogen ions in the plasma. Suitable flow rates for the diluent gases are in the range of 0–2000 sccm.

In some embodiments, further control over the reduction reaction may be provided by using a purely thermal process to heat the substrate, as indicated at block 120. The reduction reaction is generally enhanced at higher temperatures, so that using a heating source, in addition to the heating provided by the plasma, may increase the rate of oxide reduction and may allow the reaction to penetrate deeper into the bulk of the germanium substrate. Suitable temperatures for such reactions may be as high as 550° C., with the substrate being heated to a temperature between 350 and 550° C. in one embodiment.

Prior to deposition of a dielectric over of the germanium substrate, in some embodiments a protective layer of amorphous silicon may be formed by exposing the substrate to a plasma formed from a silicon-containing gas. This may especially suitable in embodiments in which the dielectric to be deposited comprises an oxide since the existence of the protective layer will act to prevent reoxidation of the germanium surface when exposed to oxidizing agents. FIG. 1 illustrates two different techniques that may be used in forming the protective layer, one in which the treatment plasma is terminated before forming the protective-layer plasma and one in which a plasma is maintained continuously, with the gaseous content being changed to switch for the treatment plasma to the protective-layer plasma.

The left portion of FIG. 1 illustrates an embodiment in which the treatment-gas plasma is terminated, as indicated at block 124, with the protective-layer plasma being formed separately at block 132. Such as approach allows the gases used for the protective-layer plasma to be stabilized prior to generation of the plasma, which may be desirable in some applications where uniformity is a significant concern. The right portion of FIG. 1 illustrates an embodiment in which the plasma is maintained at block 128, a feature that may be desirable in some applications where high levels of throughput are wanted. In either instance, a suitable precursor gas may comprise a silane such as $SiH_4$, perhaps also with a diluent gas such as an inert gas to provide greater control over deposition characteristics. As for the treatment plasma, the protective-layer plasma may be formed in the process chamber or may be formed with a remote plasma source in different embodiments.

The amorphous-silicon protective layer is thus deposited at block 136 with the plasma, as denoted by reference number 208 in the third panel of FIG. 2. In some embodiments, deposition of the protective layer 208 may also be enhanced by heating the substrate with a thermal application in addition to using heat generated by the plasma. For example, in one embodiment, the substrate is heated to a temperature between 350 and 550° C. during deposition of the amorphous-silicon layer. Use of an increased temperature generally increases adsorption of silicon ions from the plasma to enhance production of the amorphous-silicon layer.

Once deposition of the protective layer 208 has been completed, a dielectric layer may be deposited. The protective layer 208 acts as a barrier to prevent interaction of substances used in depositing the dielectric layer with the oxide-reduce germanium substrate. FIG. 1 indicates explicitly at block 140 that an oxide layer may be deposited and indicates explicitly at block 144 that a nitride layer may be deposited, but the invention is not intended to be limited to deposition of any particular dielectric layer. The oxide layer may comprise undoped silicate glass $SiO_2$ or may comprise a silicate glass doped with such elements as fluorine, boron, phosphorus, nitrogen, and the like. Similarly, the nitride layer may comprise undoped or doped silicon nitride. The deposition of the dielectric may be performed using any suitable method to known to those of skill in the art. In some embodiments, a plasma deposition process is used, with the deposition being performed in the same process chamber as the oxide-reduction treatment. Such a plasma deposition process may generate a plasma in the process chamber or use a remote plasma source in different embodiments, and proceeds by supplying appropriate precursor gases from which the plasma is generated. For instance, deposition of silicon oxide might use $SiH_4$ and $O_2$ as precursor gases, perhaps also with an inert diluent gas and perhaps also with a dopant source.

There are a variety of techniques that may be used in some embodiments to limit metallic contamination such as may arise from reactions of surfaces of the process chamber with the plasma(s) that are used in the methods described above. For example, in some embodiments, a downstream in situ dry clean may be used. Such a cleaning process is generally less aggressive on the chamber so that metallic contamination is reduced. Other techniques that may be used to minimize metallic contamination include the use of a ceramic heater and process kit.

Figure 3A:
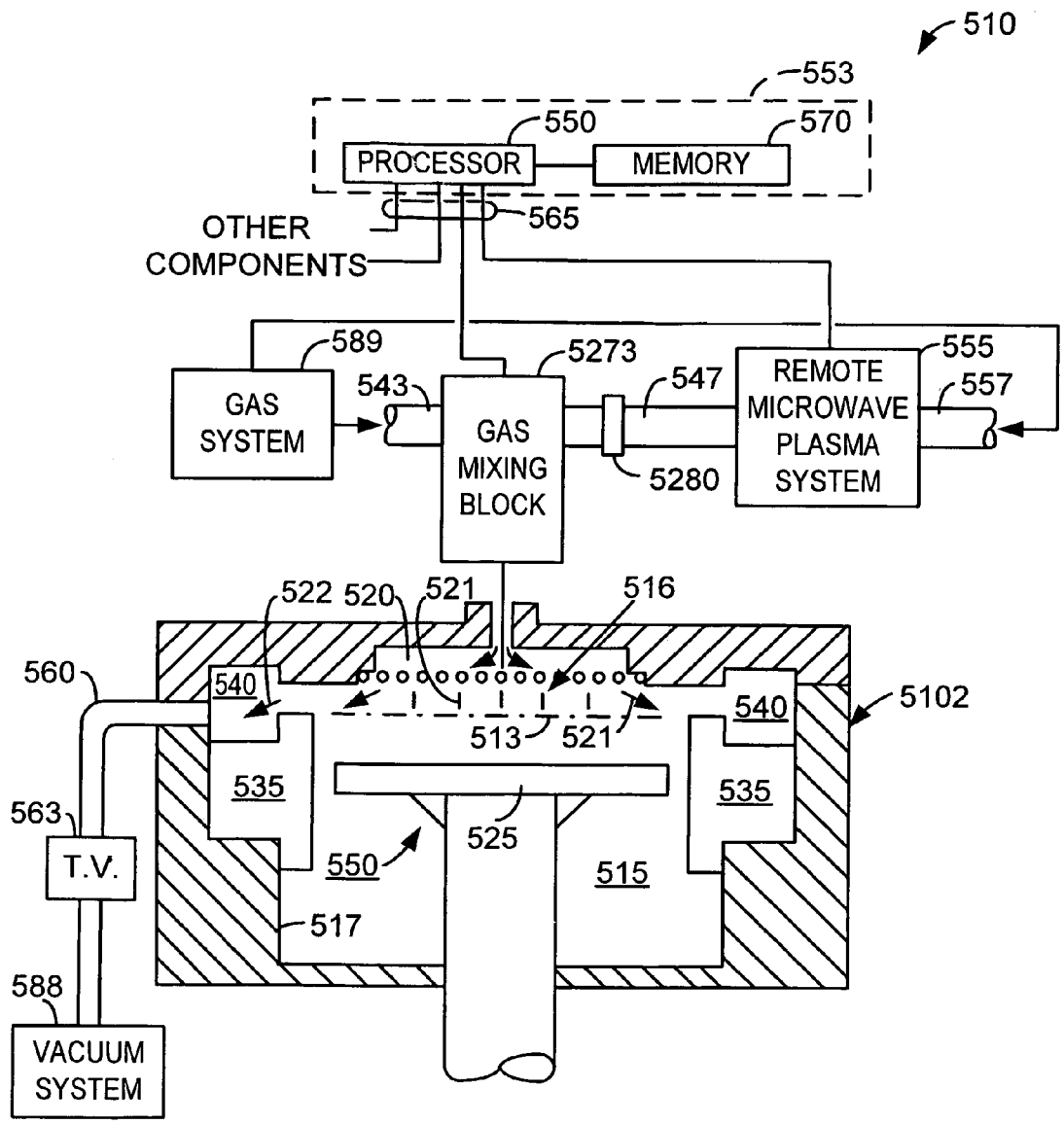
FIG. 3A is a simplified representation of a dielectric CVD apparatus that may be used to perform the methods illustrated by FIG. 1.

Attention is now directed to FIG. 3A, which illustrates a CVD system 510 that may be used in some embodiments in performing the methods outlined above. This system is suitable for performing a variety of CVD as well as other processes, including reflow, drive-in, cleaning, etching, and gettering processes. Multiple-step processes can also be performed on a single substrate or wafer without removing the substrate from the chamber. The major components of the system include, among others, a vacuum chamber 515 that receives process and other gases from a gas delivery system 589, a vacuum system 588, a remote microwave plasma system 555, and a control system 553. These and other components are described in detail below.

The CVD apparatus 510 includes an enclosure assembly 5102 housing a vacuum chamber 515 with a gas reaction area 516. A gas distribution plate 520 is provided above the gas reaction area 516 for dispersing reactive gases and other gases, such as purge gases, through perforated holes in the gas distribution plate 520 to a wafer (not shown) that rests on a vertically movable heater 525 (also referred to as a wafer support pedestal). The heater 525 can be controllably moved between a lower position, where a wafer can be loaded or unloaded, for example, and a processing position closely adjacent to the gas distribution plate 520, indicated by a dashed line 513, or to other positions for other purposes, such as for an etch or cleaning process. A center board (not shown) includes sensors for providing information on the position of the wafer.

The heater 525 includes an electrically resistive heating element (not shown) enclosed in a ceramic. The ceramic protects the heating element from potentially corrosive chamber environments and allows the heater to attain temperatures up to about 800° C. In an exemplary embodiment, all surfaces of the heater 525 exposed to the vacuum chamber 515 are made of a ceramic material, such as aluminum oxide ($Al_2O_3$ or alumina) or aluminum nitride.

Reactive and carrier gases are supplied through the supply line 543 into a gas mixing box (also called a gas mixing block) 5273, where they are preferably mixed together and delivered to the gas distribution plate 520. The gas mixing box 5273 is preferably a dual input mixing block coupled to a process gas supply line 543 and to a cleaning/etch gas conduit 547. A valve 5280 operates to admit or seal gas or plasma from the gas conduit 547 to the gas mixing block 5273. The gas conduit 547 receives gases from an integral remote microwave plasma system 555, which has an inlet 557 for receiving input gases. During deposition processing, gas supplied to the plate 520 is vented toward the wafer surface (as indicated by arrows 521), where it may be uniformly distributed radially across the wafer surface, typically in a laminar flow.

Purging gas may be delivered into the vacuum chamber 515 from the plate 520 and/or an inlet port or tube (not shown) through the bottom wall of enclosure assembly 5102. The purging gas flows upward from the inlet port past the heater 525 and to an annular pumping channel 540. An exhaust system then exhausts the gas (as indicated by arrows 522) into the annular pumping channel 540 and through an exhaust line 560 to a vacuum system 588, which includes a vacuum pump (not shown). Exhaust gases and entrained particles are drawn from the annular pumping channel 540 through the exhaust line 560 at a rate controlled by a throttle valve system 563.

The remote microwave plasma system 555 can produce a plasma for selected applications, such as chamber cleaning or etching native oxide or residue from a process wafer. Plasma species produced in the remote plasma system 555 from precursors supplied via the input line 557 are sent via the conduit 547 for dispersion through the plate 520 to the vacuum chamber 515. Precursor gases for a cleaning application may include fluorine, chlorine, and other reactive elements. The remote microwave plasma system 555 also may be adapted to deposit plasma-enhanced CVD films by selecting appropriate deposition precursor gases for use in the remote microwave plasma system 555.

The system controller 553 controls activities and operating parameters of the deposition system. The processor 550 executes system control software, such as a computer program stored in a memory 570 coupled to the processor 550. Preferably, the memory 570 may be a hard disk drive, but of course the memory 570 may be other kinds of memory, such as read-only memory or flash memory. In addition to a hard disk drive (e.g., memory 570), the CVD apparatus 510 in a preferred embodiment includes a floppy disk drive and a card rack (not shown).

The processor 550 operates according to system control software, which includes sets of instructions that dictate the timing, mixture of gases, chamber pressure, chamber temperature, microwave power levels, susceptor position, and other parameters of a particular process. Other computer programs such as those stored on other memory including, for example, a floppy disk or another computer program product inserted in a disk drive or other appropriate drive, may also be used to operate the processor 550 to configure the CVD system 510 into various apparatus.

The processor 550 has a card rack (not shown) that contains a single-board computer, analog and digital input/output boards, interface boards and stepper motor controller boards. Various parts of the CVD system 510 conform to the Versa Modular European (VME) standard which defines board, card cage, and connector dimensions and types. The VME standard also defines the bus structure having a 16-bit data bus and 24-bit address bus.

Figure 3B:
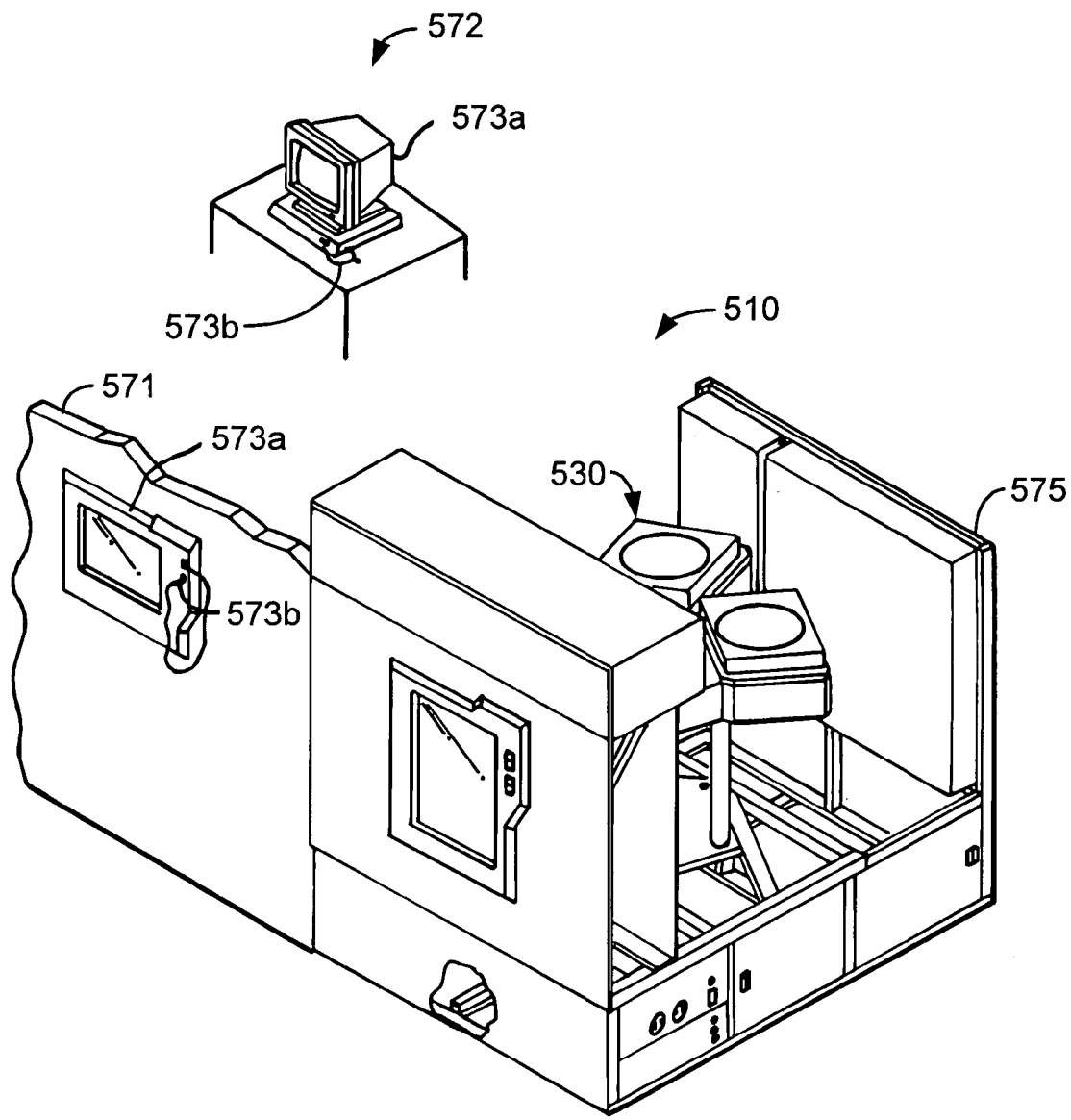
FIG. 3B is a simplified representation of the user interface for the dielectric CVD system illustrated in FIG. 3A in relation to a deposition chamber in a multi-chamber system.

FIG. 3B is a simplified diagram of a user interface in relation to the CVD apparatus chamber 530. The CVD apparatus 510 includes one chamber of a multichamber system. Wafers may be transferred from one chamber to another for additional processing. In some cases the wafers are transferred under vacuum or a selected gas. The interface between a user and the processor is via a CRT monitor 573a and a light pen 573b. A mainframe unit 575 provides electrical, plumbing, and other support functions for the CVD apparatus 510. Exemplary mainframe units compatible with the illustrative embodiment of the CVD apparatus are currently commercially available as the PRECISION 5000™, the CENTURA 5200™, and the PRODUCER SE™ systems from APPLIED MATERIALS, INC. of Santa Clara, Calif.

In one embodiment two monitors 573a are used, one mounted in the clean room wall 571 for the operators, and the other behind the wall 572 for the service technicians. Both monitors 573a simultaneously display the same information, but only one light pen 573b is enabled. The light pen 573b detects light emitted by the CRT display with a light sensor in the tip of the pen. To select a particular screen or function, the operator touches a designated area of the display screen and pushes the button on the pen 573b. The touched area changes its highlighted color, or a new menu or screen is displayed, confirming communication between the light pen and the display screen. Of course, other devices, such as a keyboard, mouse, or other pointing or communication device, may be used instead of or in addition to the light pen 573b to allow the user to communicate with the processor.

Figure 3C:
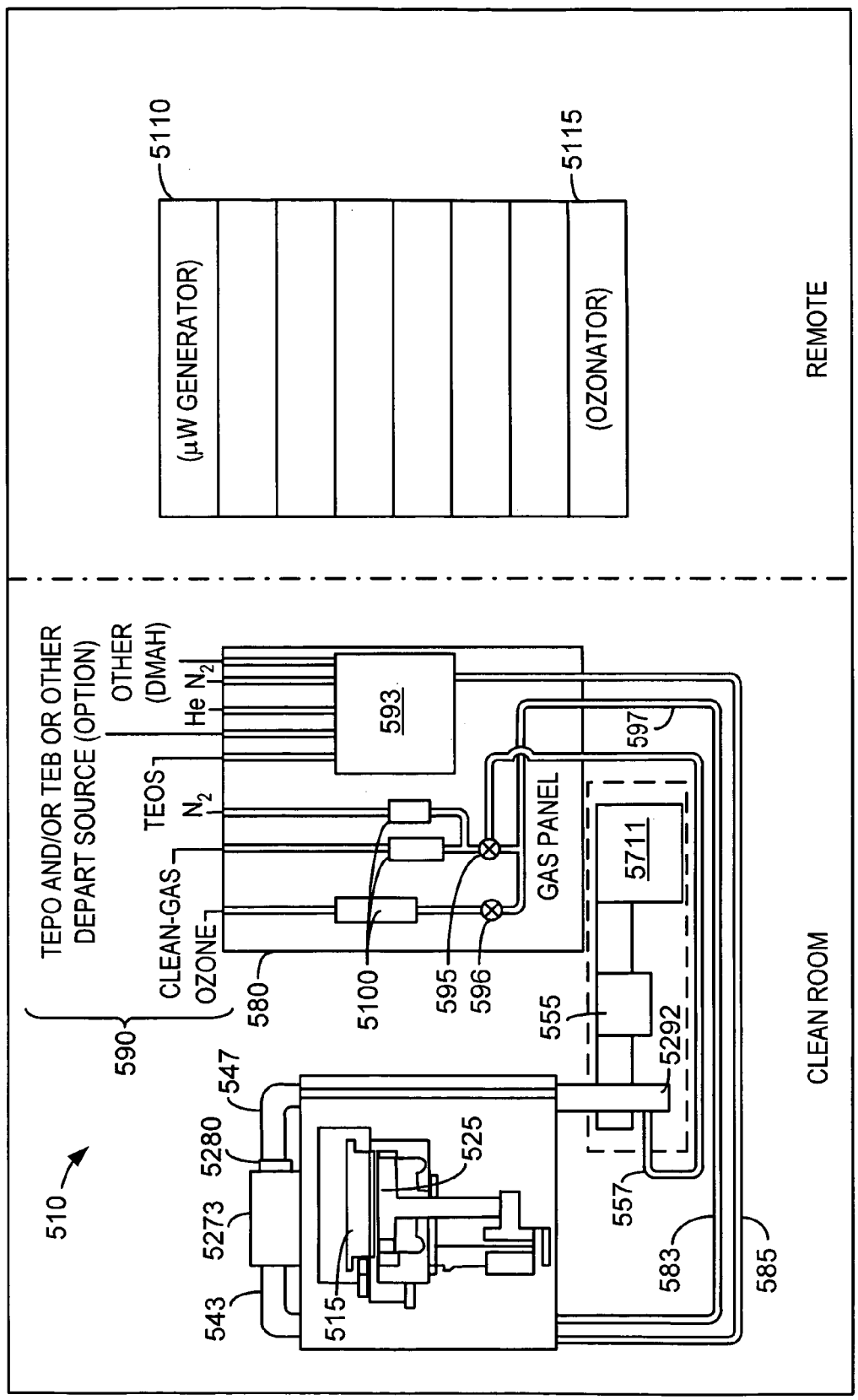
FIG. 3C is a simplified diagram of a gas panel and supply lines in relation to the deposition chamber shown in FIG. 3A.

FIG. 3C illustrates a general overview of an embodiment of the CVD apparatus 510 in relation to a gas supply panel 580 located in a clean room. As discussed above, the CVD system 510 includes a chamber 515 with a heater 525, a gas mixing box 5273 with inputs from an inlet tube 543 and a conduit 547, and remote microwave plasma system 555 with input line 557. As mentioned above, the gas mixing box 5273 is for mixing and injecting deposition gas(es) and clean gas(es) or other gas(es) through the inlet tube 543 to the processing chamber 515.

The remote microwave plasma system 555 is integrally located and mounted below the chamber 515 with the conduit 547 coming up alongside the chamber 515 to the gate valve 5280 and the gas mixing box 5273, located above the chamber 515. Microwave generator 5110 and ozonator 5115 are located remote from the clean room. Supply lines 583 and 585 from the gas supply panel 580 provide reactive gases to the gas supply line 543. The gas supply panel 580 includes lines from gas or liquid sources 590 that provide the process gases for the selected application. The gas supply panel 580 has a mixing system 593 that mixes selected gases before flow to the gas mixing box 5273. In some embodiments, gas mixing system 593 includes a liquid injection system for vaporizing reactant liquids such as tetraethylorthosilicate ("TEOS"), triethylborate ("TEB"), and triethylphosphate ("TEPO"). Vapor from the liquids is usually combined with a carrier gas, such as helium. Supply lines for the process gases may include (i) shut-off valves 595 that can be used to automatically or manually shut off the flow of process gas into line 585 or line 557, and (ii) liquid flow meters (LFM) 5100 or other types of controllers that measure the flow of gas or liquid through the supply lines.

Having fully described several embodiments of the present invention, many other equivalents and alternative embodiments will be apparent to those skilled in the art. These and other equivalents and alternatives are intended to be included within the scope of the present invention.

What is claimed is:

1. A method for reducing oxide contamination of a germanium substrate, the method comprising:
   positioning the germanium substrate in a process chamber;
   generating an ionic plasma from a treatment gas, the treatment gas comprising a flow of a hydrogen-containing gas; and
   providing the plasma to the process chamber to react with $GeO_2$ in the germanium substrate.

2. The method recited in claim 1 wherein the plasma is generated remotely from the process chamber.

3. The method recited in claim 1 wherein the plasma is generated in the process chamber.

4. The method recited in claim 1 further comprising heating the germanium substrate to a temperature less than about 550° C.

5. The method recited in claim 1 wherein the treatment gas further comprises a flow of a diluent gas.

6. The method recited in claim 5 wherein the diluent gas comprises an inert gas.

7. The method recited in claim 5 wherein the diluent gas comprises $N_2$.

8. The method recited in claim 1 wherein the hydrogen-containing gas further contains nitrogen and does not contain silicon.

9. The method recited in claim 1 wherein the hydrogen-containing gas comprises ammonia.

10. The method recited in claim 1 wherein the hydrogen-containing gas comprises $H_2$.

11. The method recited in claim 1 further comprising generating a plasma from a protective-layer gas that comprises a flow of a silicon-containing gas to deposit a protective amorphous-silicon layer over the germanium substrate after reducing the oxide contamination of the germanium substrate.

12. The method recited in claim 11 wherein generating the plasma from the protective-layer gas comprises terminating the flow of the hydrogen-containing gas and initiating the flow of the silicon-containing gas without terminating the plasma.

13. The method recited in claim 11 wherein generating the plasma from the protective-layer gas comprises:
   terminating the plasma from the treatment gas; and
   thereafter, initiating the plasma from the protective-layer gas with the flow of the silicon-containing gas.

14. The method recited in claim 11 further comprising depositing an oxide layer over the protective amorphous-silicon layer.

15. The method recited in claim 14 wherein depositing the oxide layer is performed with a plasma deposition process.

16. The method recited in claim 14 further comprising depositing a nitride layer over the protective amorphous-silicon layer.

17. A method for forming an oxide layer over a germanium substrate, the method comprising:
   positioning the germanium substrate in a process chamber;
   generating a first ionic plasma from a treatment gas, the treatment gas comprising a flow of ammonia;
   providing the first plasma to the process chamber to react with $GeO_2$ in the germanium substrate;
   thereafter, generating a second ionic plasma from a protective-layer gas that comprises a flow of silane and providing the second plasma to the process chamber to deposit a protective amorphous-silicon layer over the germanium substrate; and
   thereafter, depositing the oxide layer over the protective amorphous-silicon layer.

18. The method recited in claim 17 further comprising heating the germanium substrate to a temperature between 350 and 550° C. while providing the first plasma to the process chamber.

19. The method recited in claim 17 wherein the treatment gas further comprises a diluent flow of an inert gas.

20. The method recited in claim 17 wherein the treatment gas further comprises a diluent flow of $N_2$.

21. The method recited in claim 17 wherein generating the second plasma is performed without terminating the first plasma.

22. The method recited in claim 17 further comprising terminating the first plasma prior to generating the second plasma.

* * * * *